(12) United States Patent
Shimura

(10) Patent No.: US 9,978,769 B2
(45) Date of Patent: May 22, 2018

(54) SEMICONDUCTOR DEVICE

(71) Applicant: TOSHIBA MEMORY CORPORATION, Minato-ku (JP)

(72) Inventor: Yasuhiro Shimura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/066,190

(22) Filed: Mar. 10, 2016

(65) Prior Publication Data

US 2017/0148807 A1    May 25, 2017

Related U.S. Application Data

(60) Provisional application No. 62/257,896, filed on Nov. 20, 2015.

(51) Int. Cl.
| | |
|---|---|
| *H01L 27/115* | (2017.01) |
| *H01L 27/24* | (2006.01) |
| *H01L 27/11582* | (2017.01) |
| *H01L 23/367* | (2006.01) |
| *H01L 27/11553* | (2017.01) |
| *H01L 27/112* | (2006.01) |
| *H01L 27/11568* | (2017.01) |
| *H01L 27/11565* | (2017.01) |
| *H01L 27/11578* | (2017.01) |

(Continued)

(52) U.S. Cl.
CPC ...... *H01L 27/11582* (2013.01); *H01L 23/367* (2013.01); *H01L 27/1128* (2013.01); *H01L 27/11529* (2013.01); *H01L 27/11553* (2013.01); *H01L 27/11558* (2013.01); *H01L 27/11565* (2013.01); *H01L 27/11568* (2013.01); *H01L 27/11578* (2013.01); *H01L 27/2481* (2013.01)

(58) Field of Classification Search
CPC ........... H01L 27/2481; H01L 27/11582; H01L 27/1128; H01L 27/11529; H01L 27/11553; H01L 27/11558; H01L 27/11565; H01L 27/11568; H01L 27/11578

See application file for complete search history.

(56) References Cited

U.S. PATENT DOCUMENTS

| | | | |
|---|---|---|---|
| 8,237,218 | B2 | 8/2012 | Murata et al. |
| 8,390,055 | B2 | 3/2013 | Higashi et al. |

(Continued)

*Primary Examiner* — Thanhha Pham
(74) *Attorney, Agent, or Firm* — Oblon, McClelland, Maier & Neustadt, L.L.P.

(57) ABSTRACT

According to one embodiment, a semiconductor device includes a substrate; a stacked body; a columnar portion; a plate portion; and a sidewall insulating film. The thermal expansion coefficient of the substrate is $\alpha_1$. The stacked body includes a plurality of electrode layers and a memory cell array. The columnar portion includes a semiconductor body and a charge storage film. The plate portion includes a first layer and a second layer. The thermal expansion coefficient of the first layer is the $\alpha_2$ being different from the $\alpha_1$. The thermal expansion coefficient of the second layer is the $\alpha_3$ being different from the $\alpha_2$. The value of the $\alpha_3$ is in a direction from the value of the $\alpha_2$ toward the value of the $\alpha_1$. The second layer faces the major surface of the substrate continuously in the memory cell array.

9 Claims, 14 Drawing Sheets

(51) Int. Cl.
*H01L 27/11558* (2017.01)
*H01L 27/11529* (2017.01)

(56) References Cited

U.S. PATENT DOCUMENTS

2014/0014889 A1   1/2014  Shim et al.
2016/0268191 A1*  9/2016  Hu .................... H01L 27/11582

* cited by examiner

SEMICONDUCTOR DEVICE

CROSS-REFERENCE TO RELATED APPLICATIONS

This application is based upon and claims the benefit of priority from U.S. Provisional Patent Application 62/257,896 field on Nov. 20, 2015; the entire contents of which are incorporated herein by reference.

FIELD

Embodiments described herein relate generally to a semiconductor device.

BACKGROUND

A memory device having a three-dimensional structure has been proposed in which a memory hole is made in a stacked body in which multiple electrode layers are stacked, and a charge storage film and a semiconductor film are provided to extend in the stacking direction of the stacked body in the memory hole. The memory device includes multiple memory cells connected in series between a drain-side selection transistor and a source-side selection transistor. The electrode layers of the stacked body are gate electrodes of the drain-side selection transistor, the source-side selection transistor, and the memory cells. A slit that reaches a substrate from the upper surface of the stacked body is made in the stacked body. A conductor is filled into the slit. For example, the conductor is used to form a source line. Peeling of the stacked body may occur and warp of the substrate may occur when volume reduction or the like of the conductor occurs. Stress relief of the conductor is desirable.

DETAILED DESCRIPTION

Figure 1:
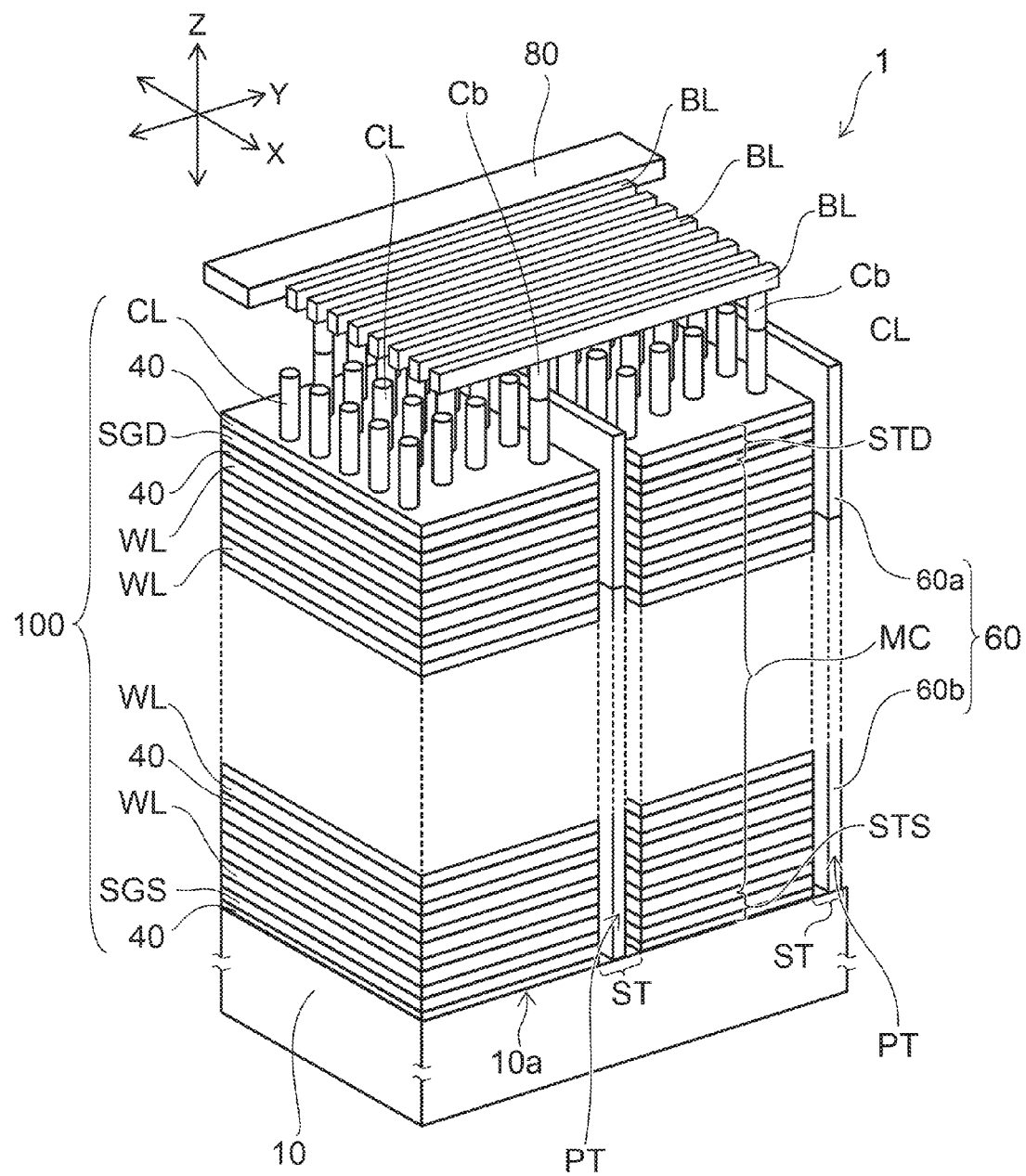
FIG. 1 is a schematic perspective view of a memory cell array of a semiconductor device of a first embodiment.

According to one embodiment, a semiconductor device includes a substrate; a stacked body; a columnar portion; a plate portion; and a sidewall insulating film. The substrate has a major surface. The thermal expansion coefficient of the substrate is $\alpha_1$. The stacked body is provided on the major surface of the substrate. The stacked body includes a plurality of electrode layers and a memory cell array, the plurality of electrode layers is stacked with an insulator interposed. The columnar portion is provided in the stacked body. The columnar portion extends along a stacking direction of the stacked body. The columnar portion includes a semiconductor body and a charge storage film. The charge storage film is provided between the semiconductor body and the electrode layer. The plate portion is provided in the stacked body. The plate portion extends along the stacking direction of the stacked body and a first direction crossing the stacking direction. The plate portion includes a first layer and a second layer. The thermal expansion coefficient of the first layer is the $\alpha_2$ being different from the $\alpha_1$. The thermal expansion coefficient of the second layer is the $\alpha_3$ being different from the $\alpha_2$. The value of the $\alpha_3$ is in a direction from the value of the $\alpha_2$ toward the value of the $\alpha_1$. The first layer and the second layer are stacked along the stacking direction of the stacked body. The second layer is provided between the first layer and the major surface of the substrate. The second layer faces the major surface of the substrate continuously in the memory cell array. The sidewall insulating film is provided in the stacked body. The sidewall insulating film is provided between the stacked body and the plate portion.

Embodiments will now be described with reference to the drawings. In the respective drawings, like members are labeled with like reference numerals. Semiconductor devices of the embodiments are semiconductor memory devices having memory cell arrays.

FIG. 1 is a schematic perspective view of a memory cell array 1 of a semiconductor device of a first embodiment. In FIG. 1, two mutually-orthogonal directions parallel to a major surface 10a of a substrate 10 are taken as an X-direction and a Y-direction. The XY plane is taken to be a planar direction of a stacked body 100. A direction orthogonal to both the X-direction and the Y-direction is taken as a Z-direction (the stacking direction of the stacked body 100). In the specification, "down" refers to the direction toward the substrate 10; and "up" refers to the direction away from the substrate 10.

As shown in FIG. 1, the memory cell array 1 includes the stacked body 100, multiple columnar portions CL, and multiple slits ST. The stacked body 100 includes a drain-side selection gate line SGD, multiple word lines WL, and a source-side selection gate line SGS.

The source-side selection gate line (the lower gate layer) SGS is provided on the substrate 10. The substrate 10 is, for example, a semiconductor substrate. The semiconductor substrate includes, for example, silicon. The silicon that is included in the substrate 10 is single crystalline silicon. The portion of the substrate 10 that includes the single crystalline silicon where the memory cell array 1 is provided includes a carrier. The carrier is, for example, an acceptor. The acceptor is, for example, boron. Thereby, the conductivity type of the substrate 10 is a P-type in the portion where the memory cell array 1 is provided. The multiple word lines WL are provided on the source-side selection gate line SGS. The drain-side selection gate line (the upper gate layer) SGD is provided on the multiple word lines WL. The drain-side selection gate line SGD, the multiple word lines WL, and the source-side selection gate line SGS are electrode layers. The number of stacks of electrode layers is arbitrary.

The electrode layers (SGD, WL, and SGS) are stacked to be separated from each other. An insulator 40 is disposed in each region between the electrode layers (SGD, WL, and SGS). The insulator 40 may be an insulator such as a silicon oxide film, etc., or may be an air gap.

At least one selection gate line SGD is used as a gate electrode of a drain-side selection transistor STD. At least one selection gate line SGS is used as a gate electrode of a source-side selection transistor STS. Multiple memory cells MC are connected in series between the drain-side selection transistor STD and the source-side selection transistor STS. One of the word lines WL is used as a gate electrode of the memory cell MC.

The slit ST is provided in the stacked body 100. The slit ST is provided in the memory cell array of the stacked body 100. The slit ST extends along the stacking direction of the stacked body 100 (the Z-direction) and the major surface direction of the substrate 10 (the X-direction) in the interior of the stacked body 100. The slit ST divides the stacked body 100 into a plurality in the Y-direction. The region that is divided by the slit ST is called a "block."

The columnar portion CL is provided in the stacked body 100 divided by the slit ST. The columnar portion CL is provided in the memory cell array of the stacked body 100. The columnar portion CL extends in the stacking direction of the stacked body 100 (the Z-direction) in the interior of the stacked body 100. For example, the columnar portion CL is formed in a circular columnar configuration or an elliptical columnar configuration. For example, the columnar portion CL is disposed in a staggered lattice configuration or a square lattice configuration in the memory cell array 1. The drain-side selection transistor STD, the multiple memory cells MC, and the source-side selection transistor STS are disposed in the columnar portion CL.

Multiple bit lines BL are disposed above the upper end portion of the columnar portion CL. The multiple bit lines BL extend in the Y-direction. The upper end portion of the columnar portion CL is electrically connected via a contact portion Cb to one of the bit lines BL. One bit line is electrically connected to one columnar portion CL selected from each block.

A plate portion PT is provided in the slit ST. The plate portion PT includes a conductor 60. The conductor 60 includes a first layer 60a and a second layer 60b. The first layer 60a and the second layer 60b are stacked along the stacking direction of the stacked body 100 (the Z-direction). The second layer 60b is provided between the first layer 60a and the major surface 10a of the substrate 10. The first layer 60a is a conductor. The first layer 60a includes, for example, tungsten. The first layer 60a is a source line SL. An upper layer interconnect 80 is disposed above the first layer 60a. The upper layer interconnect 80 extends in the Y-direction. The upper layer interconnect 80 is electrically connected to multiple first layers 60a arranged along the Y-direction. The second layer 60b includes a conductor or a semiconductor. In the first embodiment, the second layer 60b includes, for example, silicon. The silicon is, for example, polysilicon. The polysilicon may be polysilicon made of amorphous silicon that is crystallized. The conductivity type of the polysilicon is the N-type or the P-type. In the first embodiment, the substrate includes silicon. A major component included in the substrate 10 is silicon. In the case where the second layer 60b is polysilicon, a major component included in the second layer 60b is silicon which is the same as the substrate 10. Also, the second layer 60b may be an insulator. When the second layer 60b is an insulator, the second layer 60b includes, for example, silicon oxide.

Figure 2:
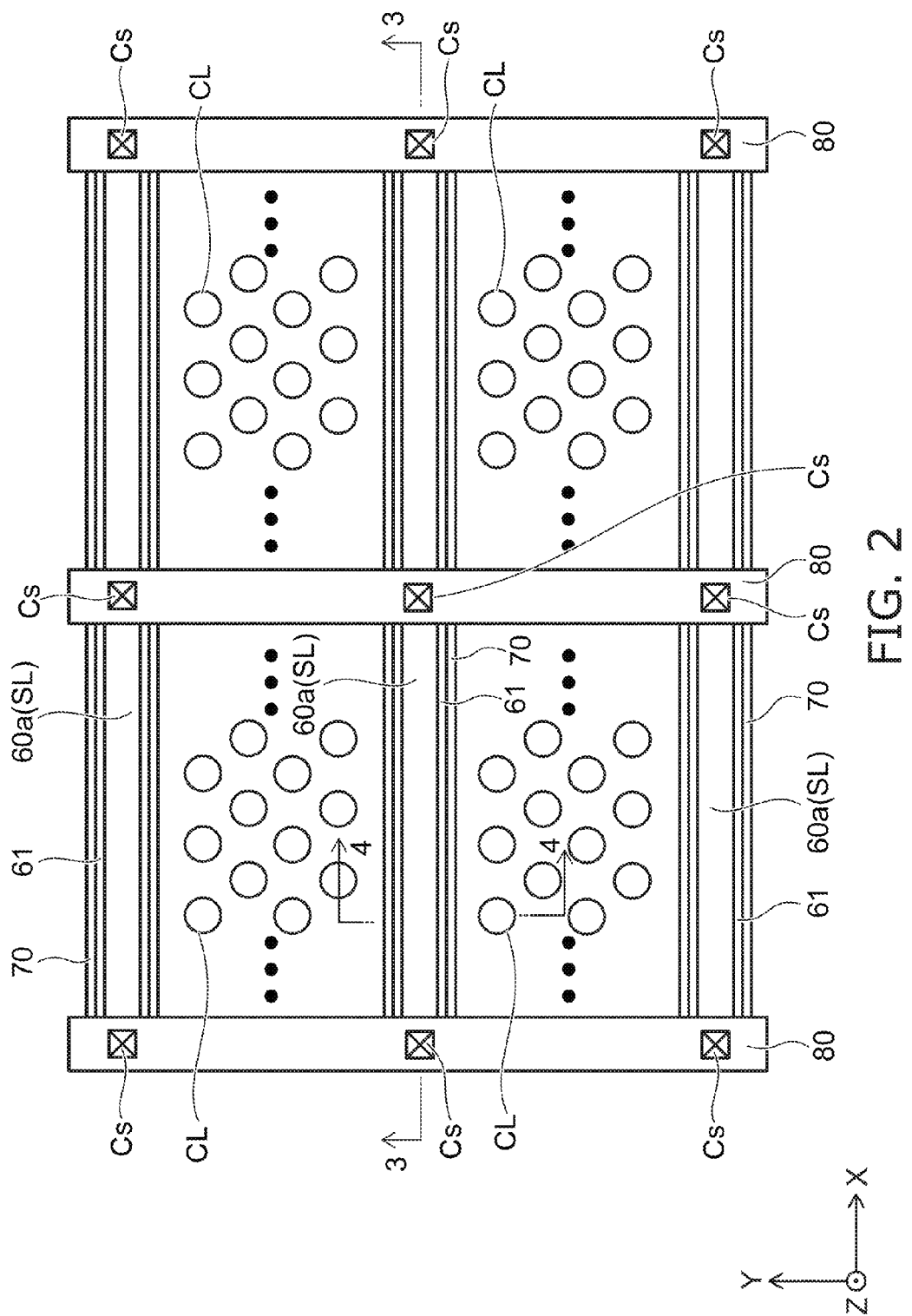
FIG. 2 is a schematic plan view of the memory cell array of the semiconductor device of the first embodiment.
Figure 3:
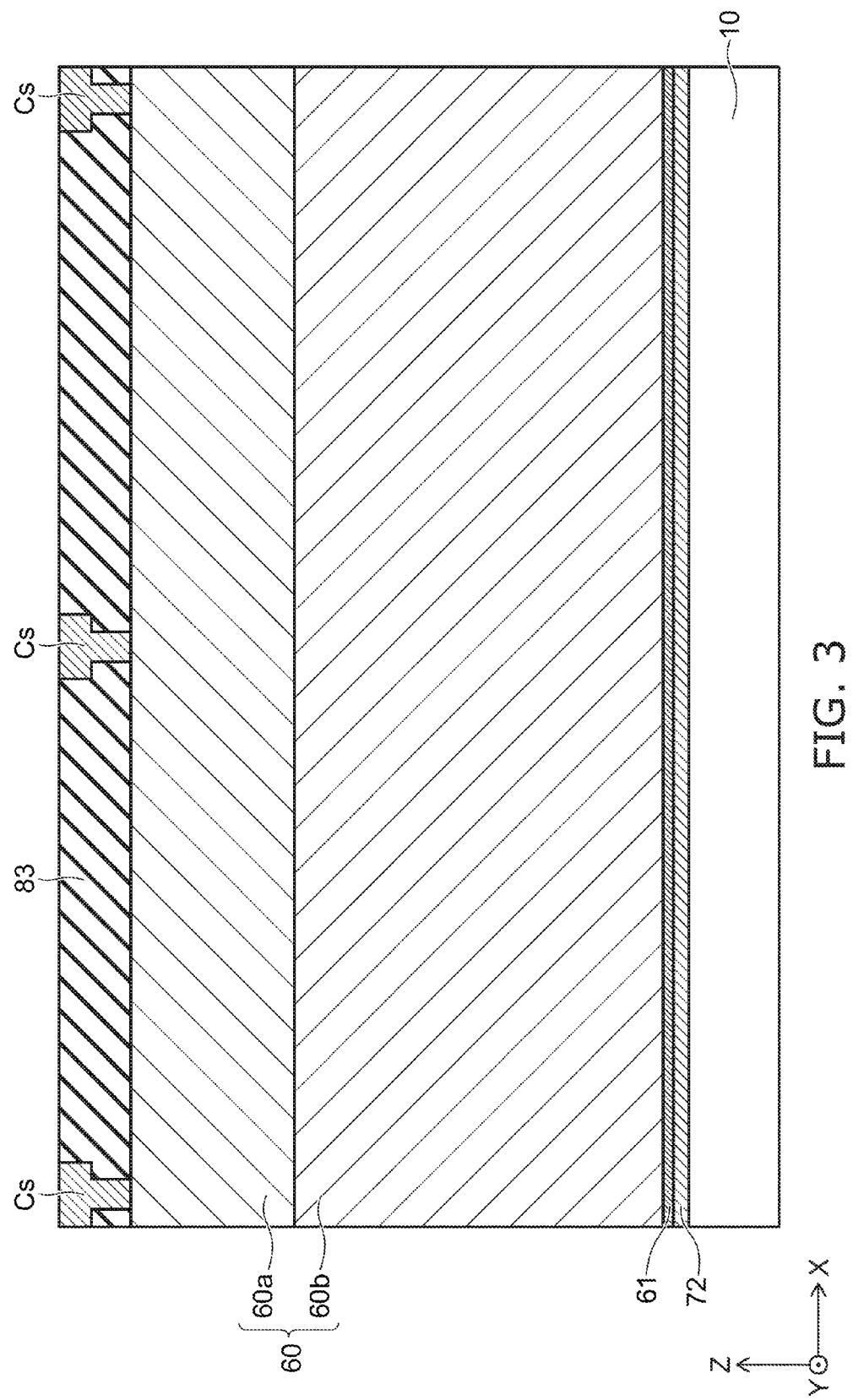
FIG. 3 is a schematic cross-sectional view along line 3-3 in FIG. 2.
Figure 4:
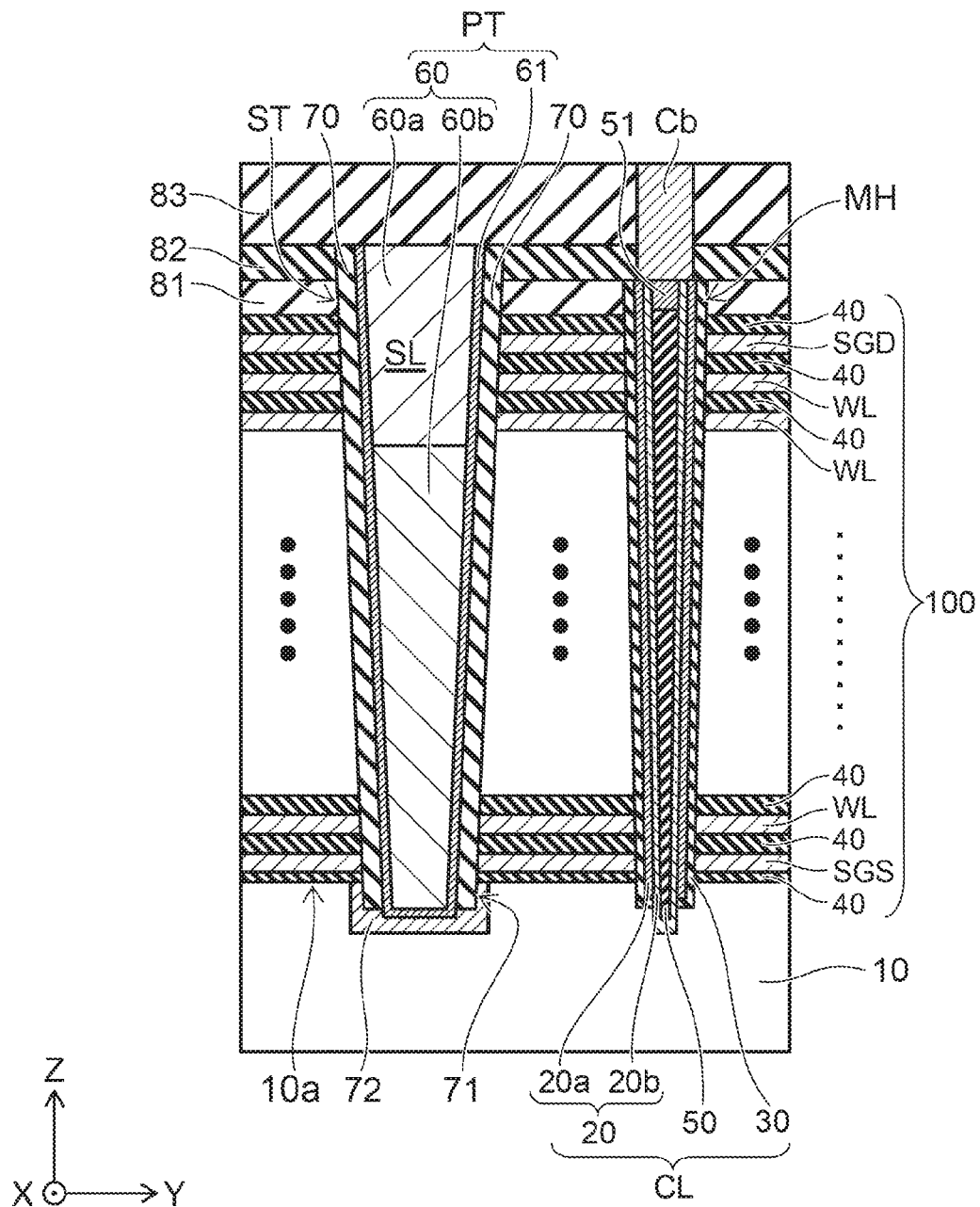
FIG. 4 is a schematic cross-sectional view along line 4-4 in FIG. 2.

FIG. 2 is a schematic plan view of the memory cell array 1 of the semiconductor device of the first embodiment. FIG. 3 is a schematic cross-sectional view along line 3-3 in FIG. 2. FIG. 4 is a schematic cross-sectional view along line 4-4 in FIG. 2. The bit lines BL are not shown in FIG. 2 to FIG. 4. The upper layer interconnect 80 is not shown in FIG. 3 and FIG. 4.

As shown in FIG. 2 to FIG. 4, the columnar portion CL is provided in a memory hole (a hole) MH. The memory hole MH is provided in the memory cell array 1 of the stacked body 100. The memory hole MH extends along the stacking direction of the stacked body 100 (the Z-direction) in the stacked body 100. The columnar portion CL includes a memory film 30, a semiconductor body 20, and a core layer 50.

The electrode layers (SGD, WL, and SGS) are provided on the memory film 30 in the interior of the stacked body 100. The electrode layers (SGD, WL, and SGS) include, for example, tungsten. The electrode layers (SGD, WL, and SGS) surround the periphery of the columnar portion CL.

The memory film 30 is provided on the inner wall of the memory hole MH. The configuration of the memory film 30 is, for example, a tubular configuration. The memory film 30 includes a cover insulating film, a charge storage film, and a tunneling insulating film (the cover insulating film, the charge storage film, and the tunneling insulating film are not shown in FIG. 2 to FIG. 4). The cover insulating film is provided on the inner wall of the memory hole MH. The charge storage film is provided on the cover insulating film. The tunneling insulating film is provided on the charge storage film. For example, the cover insulating film includes silicon oxide, or includes silicon oxide and aluminum oxide. For example, the cover insulating film protects the charge storage film from the etching when forming the electrode layers (SGD, WL, and SGS). The charge storage film includes, for example, silicon nitride. Other than silicon nitride, the charge storage film may include hafnium oxide. The charge storage film has trap sites that trap charge in a film. The threshold of the memory cell MC changes due to the existence/absence of the charge trapped in the trap sites and the amount of the trapped charge. Thereby, the memory cell MC retains information. For example, the tunneling insulating film includes silicon oxide, or includes silicon oxide and silicon nitride. The tunneling insulating film is a potential barrier between the charge storage film and the semiconductor body 20. Tunneling of the charge occurs in the tunneling insulating film when the charge is injected from the semiconductor body 20 into the charge storage film (a programming operation) and when the charge is diffused from the charge storage film into the semiconductor body (an erasing operation).

The semiconductor body 20 is provided on the memory film 30. The semiconductor body 20 of the first embodiment includes a cover layer 20a and a channel layer 20b. The cover layer 20a is provided on the tunneling insulating film of the memory film 30. The configuration of the cover layer 20a is, for example, a tubular configuration. The channel layer 20b is provided on the cover layer 20a. The configuration of the channel layer 20b is, for example, a tubular configuration having a bottom. The cover layer 20a and the channel layer 20b include, for example, silicon. The silicon is, for example, polysilicon made of amorphous silicon that is crystallized. The conductivity type of the silicon is, for example, the P-type. For example, the semiconductor body 20 is electrically connected to the substrate 10.

The core layer 50 is provided on the semiconductor body 20. The core layer 50 is insulative. The core layer 50 includes, for example, silicon oxide. The configuration of the core layer 50 is, for example, a columnar configuration. A capping layer 51 is provided on the upper surface of the core layer 50. The capping layer 51 includes, for example, silicon. The silicon is, for example, polysilicon made of amorphous silicon that is crystallized. The conductivity type of the silicon is, for example, the N-type. The capping layer 51 is electrically connected to the semiconductor body 20 at the upper portion of the memory hole MH.

The memory hole MH is filled with the memory film 30, the semiconductor body 20, the core layer 50, and the capping layer 51.

A sidewall insulating film 70 is further provided in the slit ST. The sidewall insulating film 70 is provided between the stacked body 100 and the plate portion PT. Thereby, the plate portion PT is insulated from the stacked body 100. The sidewall insulating film 70 includes, for example, silicon oxide. The lower end of the sidewall insulating film 70 contacts the substrate 10 at the bottom portion of the slit ST.

The plate portion PT further includes a barrier film 61. For example, the barrier film 61 is provided between the plate portion PT and the sidewall insulating film 70 and between the plate portion PT and the substrate 10. The barrier film 61 includes, for example, titanium. The barrier film 61 may include titanium and titanium nitride. In the first embodiment, the plate portion PT is electrically connected to the substrate 10 via the barrier film 61.

In the first embodiment, the substrate 10 includes a recess portion 71 in the major surface 10a. The recess portion 71 is provided in the substrate 10 to correspond to the slit ST. A semiconductor region 72 is provided in the substrate 10 to correspond to the recess portion 71. The semiconductor region 72 includes, for example, an acceptor and a donor. The semiconductor region 72 is, for example, a region to which the donor is additionally introduced to the substrate 10 including the acceptor. When the conductivity type of the substrate 10 is the P-type, the conductivity type of the semiconductor region 72 is the N-type or the P-type. The semiconductor region 72 is, for example, a region to which the donor that is the opposite conductivity type of the substrate 10 including the acceptor is additionally introduced. The acceptor is, for example, boron (B). The donor is, for example, arsenic (As) or phosphorus (P).

In the first embodiment, for example, the barrier film 61 and the sidewall insulating film 70 contact the semiconductor region 72 via the recess portion 71. For example, the plate portion PT is electrically connected to the semiconductor region 72 via the barrier film 61.

When the second layer 60b includes a conductor or a semiconductor, the first layer 60a is electrically connected to the semiconductor region 72 via the second layer 60b and the barrier film 61.

When the second layer 60b includes the semiconductor, the conductivity type of the second layer 60b may be a conductivity type that is different from the conductivity type of the semiconductor region 72. However, it is favorable for the conductivity type of the second layer 60b to be the same conductivity type as the conductivity type of the semiconductor region 72. This is because the occurrence of a P-N junction (a potential barrier) in the current path of the semiconductor device can be suppressed. For example, if the conductivity type of the semiconductor region 72 is the N-type, the conductivity type of the second layer 60b is the N-type. If the conductivity type of the semiconductor region 72 is the P-type, the conductivity type of the second layer 60b is the P-type. In the case where there is no semiconductor region 72, it is sufficient for the conductivity type of the second layer 60b to be the same conductivity type as the conductivity type of the substrate 10.

When the second layer 60b includes the insulator, the first layer 60a is electrically connected to the semiconductor region 72 via the barrier film 61. The barrier film 61 electrically connects the first layer 60a and the semiconductor region 72 on the sidewall insulating film 70.

A first insulating film 81, a second insulating film 82, and a third insulating film 83 are provided on the upper surface of the stacked body 100. The first insulating film 81 is provided on the stacked body 100. The second insulating film 82 is provided on the first insulating film 81. The third insulating film 83 is provided on the second insulating film 82.

Each of the first insulating film 81, the second insulating film 82, and the third insulating film 83 includes, for example, silicon oxide.

The memory hole MH is made from the surface of the first insulating film 81 toward the interior of the stacked body 100. The second insulating film 82 covers the upper end of the memory hole MH. The slit ST is made from the surface of the second insulating film 82 toward the interior of the stacked body 100 via the first insulating film 81. The third insulating film 83 covers the upper end of the slit ST.

As shown in FIG. 1 and FIG. 4, the contact portion Cb is provided in the second insulating film 82 and the third insulating film 83. The contact portion Cb includes a conductor. The contact portion Cb is electrically connected to the capping layer 51 and the semiconductor body 20. The bit line BL is electrically connected to the contact portion Cb.

As shown in FIG. 2 and FIG. 3, a contact portion Cs is provided in the third insulating film 83. The contact portion Cs includes a conductor. The contact portion Cs is electrically connected to the plate portion PT. The upper layer interconnect 80 is electrically connected to the contact portion Cs.

Figure 5:
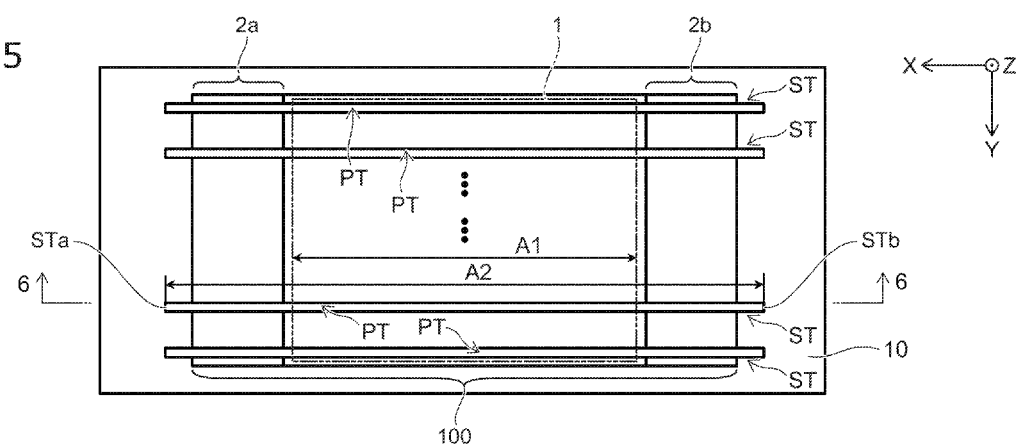
FIG. 5 is a schematic plan view of the semiconductor device of the first embodiment.
Figure 6:
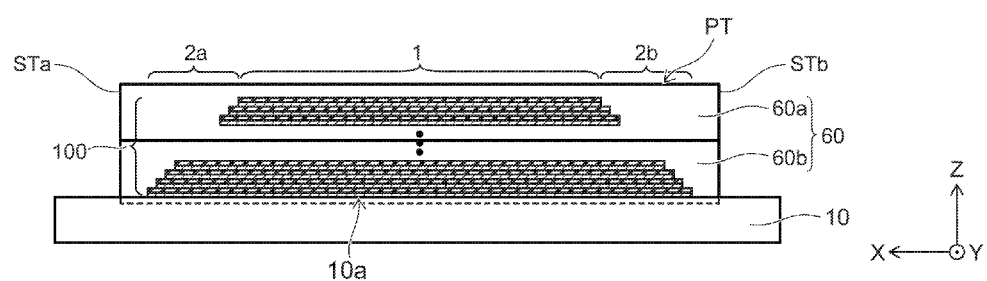
FIG. 6 is a cross-sectional view along line 6-6 in FIG. 5.

FIG. 5 is a schematic plan view of the semiconductor device of the first embodiment. FIG. 6 is a cross-sectional view along line 6-6 in FIG. 5.

As shown in FIG. 5 and FIG. 6, the stacked body 100 includes the memory cell array 1, a first stairstep structure portion 2a, and the second stairstep structure portion 2b on the substrate 10. The first stairstep structure portion 2a and a second stairstep structure portion 2b are provided on outer sides of the memory cell array 1. For example, in the case where the planar configuration of the memory cell array 1 is a rectangular configuration, for example, the first stairstep structure portion 2a and the second stairstep structure portion 2b are provided respectively along one set of opposite sides of the memory cell array 1.

Inside the stacked body 100, the slit ST is provided to cross the memory cell array 1 along the major surface direction of the substrate 10 (the X-direction) from the first stairstep structure portion 2a to the second stairstep structure portion 2b provided along the opposite sides. Thereby, similarly, the plate portion PT also is provided to cross the memory cell array 1 from the first stairstep structure portion 2a to the second stairstep structure portion 2b. As illustrated by arrow A1, the conductor 60 of the plate portion PT maintains the stacked structure including the first layer 60a and the second layer 60b at least in the memory cell array 1.

Thereby, the second layer 60b of the conductor 60 faces the major surface 10a of the substrate 10 continuously at least in the memory cell array 1. As illustrated by arrow A2, the stacked structure that includes the first layer 60a and the second layer 60b may be provided from one end STa of the slit ST to one other end STb of the slit ST. On the substrate 10, the one end STa is, for example, on the outer side of the first stairstep structure portion 2a; and the one other end STb is, for example, on the outer side of the second stairstep structure portion 2b. In such a case, the second layer 60b of the conductor 60 faces the major surface 10a of the substrate 10 from the one end STa of the slit ST to the one other end STb of the slit ST.

Figure 7:
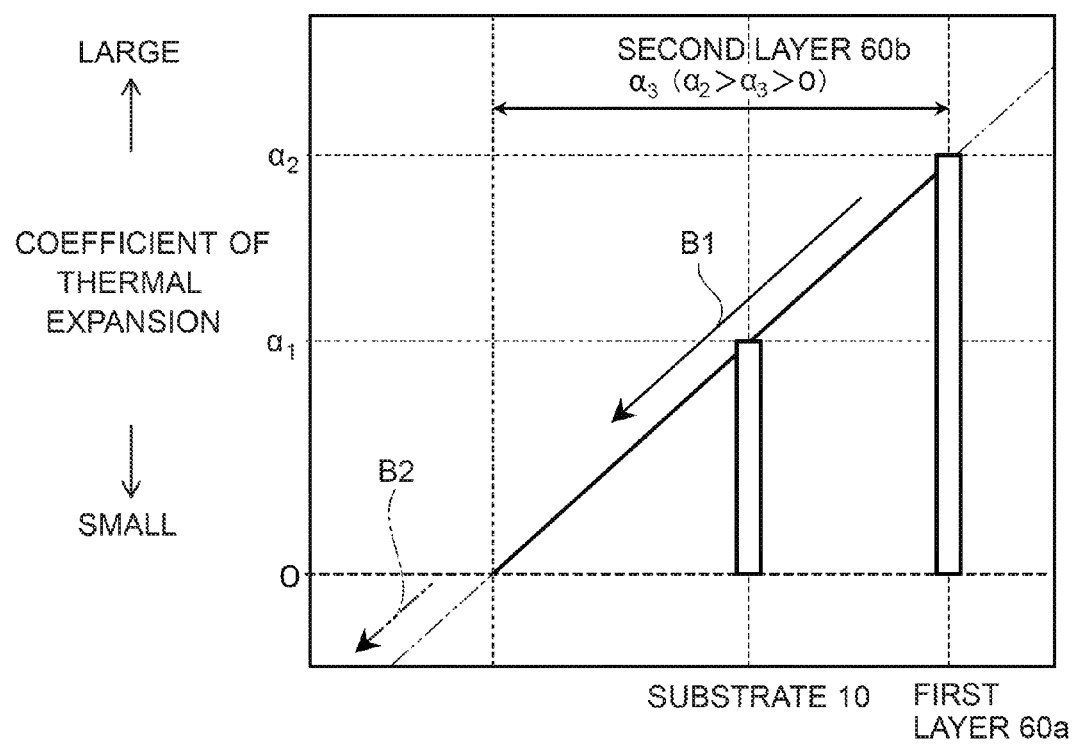
FIG. 7 is a figure showing the thermal expansion coefficients.

FIG. 7 is a figure showing the thermal expansion coefficients.

A first thermal expansion coefficient $\alpha_1$ shown in FIG. 7 is the thermal expansion coefficient of the substrate 10. A second thermal expansion coefficient $\alpha_2$ is the thermal expansion coefficient of the first layer 60a. A third thermal expansion coefficient $\alpha_3$ is the thermal expansion coefficient of the second layer 60b. In the first embodiment, the substrate 10 is single crystalline silicon. The first layer 60a is tungsten. The second layer 60b is polysilicon. A thermal expansion coefficient $\alpha_W$ of tungsten is larger than a thermal expansion coefficient $\alpha_{Si}$ of silicon. A thermal expansion coefficient $\alpha_{poly-Si}$ of polysilicon is smaller than the thermal expansion coefficient $\alpha_W$ of tungsten. The thermal expansion coefficient $\alpha_{poly-Si}$ of polysilicon is near the thermal expansion coefficient $\alpha_{Si}$ of silicon.

The linear expansion coefficient $\alpha$ and the volumetric expansion coefficient $\beta$ are two types of thermal expansion coefficients. In the specification, the first thermal expansion coefficient $\alpha_1$, the second thermal expansion coefficient $\alpha_2$, and the third thermal expansion coefficient $\alpha_3$ are, for example, linear expansion coefficients $\alpha$. However, the linear expansion coefficient $\alpha$ can be converted into the volumetric expansion coefficient $\beta$ according to the formula of "$\alpha \approx 3\beta$." Similarly, the volumetric expansion coefficient $\beta$ can be converted into the linear expansion coefficient $\alpha$ according to the formula of "$\beta \approx \alpha/3$." That is, the linear expansion coefficient $\alpha$ and the volumetric expansion coefficient $\beta$ can be mutually expressed using a proportional relationship. Accordingly, the thermal expansion coefficients recited in the specification include both the linear expansion coefficient $\alpha$ and the volumetric expansion coefficient $\beta$.

In the case where the conductor 60 of the plate portion PT includes tungsten, the conductor 60 contracts (the volume is reduced) more than the substrate 10 when, for example, the temperature of the substrate 10 decreases from the film formation temperature of tungsten to room temperature. Therefore, "compressive stress" acts in the conductor 60; "tensile stress" acts in the substrate 10; and the substrate 10 warps. When the substrate 10 warps, for example, it becomes difficult to align the focus in the lithography processes; and it becomes difficult to maintain and improve the precision of the lithography processes.

In the semiconductor device of the first embodiment, the conductor 60 of the plate portion PT has a stacked structure including the first layer 60a and the second layer 60b. The thermal expansion coefficient $\alpha_3$ of the second layer 60b is smaller than the thermal expansion coefficient $\alpha_2$ of the first layer 60a. Therefore, compared to a structure in which the entire conductor 60 is, for example, tungsten, the "compressive stress" that acts in the conductor 60 can be reduced. Accordingly, the "tensile stress" that acts in the substrate 10 is relaxed. As a result, the occurrence of the "warp" in the substrate 10 can be suppressed.

As illustrated by arrow B1 in FIG. 7, it is sufficient for the value of the thermal expansion coefficient $\alpha_3$ of the second layer 60b to be a value in the direction from the value of the thermal expansion coefficient $\alpha_2$ of the first layer 60a toward the value of the thermal expansion coefficient $\alpha_1$ of the substrate 10.

In the first embodiment, the relationship between the value of the thermal expansion coefficient $\alpha_1$ and the value of the thermal expansion coefficient $\alpha_2$ is $$\alpha_1 < \alpha_2.$$

In such a case, the value of the thermal expansion coefficient $\alpha_3$ is set to $$\alpha_3 < \alpha_2.$$

For example, in the case where the value of the $\alpha_1$ is "2.5" and the value of the $\alpha_2$ is "4.5," the value of the $\alpha_3$ is set to $$\alpha_3 < 4.5.$$

Conversely, in the case where the relationship between the value of the thermal expansion coefficient $\alpha_1$ and the value of the thermal expansion coefficient $\alpha_2$ is $$\alpha_1 > \alpha_2,$$

it is sufficient for the value of the thermal expansion coefficient $\alpha_3$ to be set to $$\alpha_3 > \alpha_2.$$

As in the first embodiment, in the case where the value of the thermal expansion coefficient $\alpha_3$ is less than the value of the thermal expansion coefficient $\alpha_2$ ($\alpha_3 < \alpha_2$), for example, it is sufficient for the value of the thermal expansion coefficient $\alpha_3$ of the second layer 60b to be selected from the range of "$\alpha_2 > \alpha_3 > 0$." The reason that the range of "$\alpha_2 > \alpha_3 > 0$" is selected is that in the current state of the art, for example, there are few inexpensive practical materials that have a negative thermal expansion coefficient. Of course, as illustrated by arrow B2, the second layer 60b of the first embodiment may have a negative thermal expansion coefficient.

Figure 8:
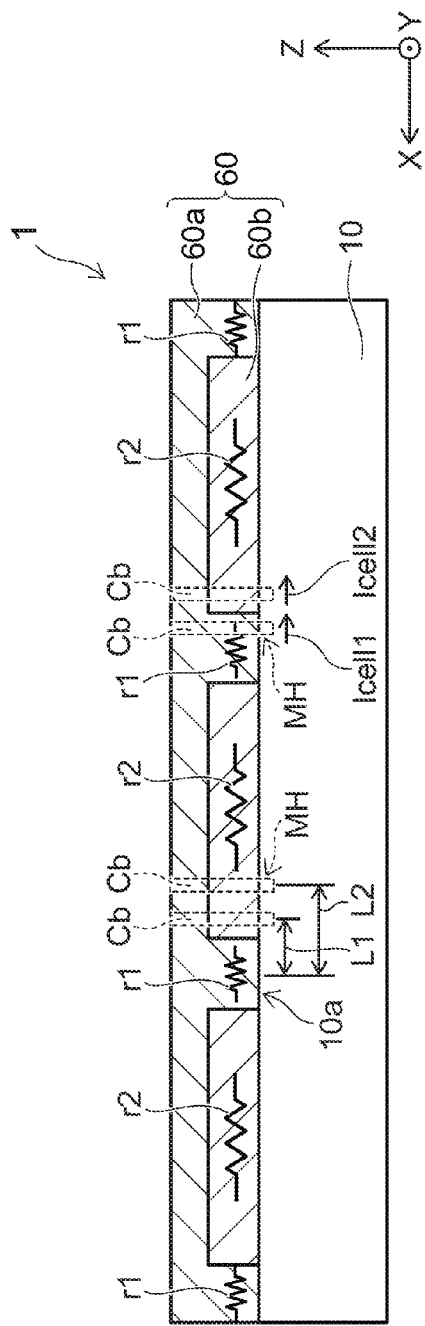
FIG. 8 is a schematic cross-sectional view of the memory cell array of a semiconductor device of a reference example.

FIG. 8 is a schematic cross-sectional view of the memory cell array 1 of a semiconductor device of a reference example.

As shown in FIG. 8, the second layer 60b may be divided by the first layer 60a in the memory cell array 1. In such a configuration as well, the "compressive stress" that acts in the conductor 60 that is on the substrate 10 can be small. However, the reference example has a configuration in which the first layer 60a and the second layer 60b are provided alternately on the major surface 10a. The first layer 60a and the second layer 60b include different materials. A sheet resistance r1 of the first layer 60a is different from a sheet resistance r2 of the second layer 60b. Therefore, a micro resistance value difference occurs on the major surface 10a.

The cell current flows through the major surface 10a in the memory cell array 1. A micro difference (fluctuation) occurs between a cell current Icell1 and a cell current Icell2, the cell current ken flows from the columnar portion CL via the major surface 10a into the first layer 60a, and the cell current Icell2 flows from the columnar portion CL via the major surface 10a into the second layer 60b. Even if, for example, the difference "Icell1−Icell2" between the cell currents is micro, when considering the progress of the downscaling of future memory devices, there is a possibility that this may be one cause of, for example, the occurrence of "misreading" or the like that reduces the reliability of the memory device.

Also, in the reference example, the second layer 60b is provided discretely on the major surface 10a. If the sheet resistance r2 of the second layer 60b is extremely high or the second layer 60b is an insulator, lengths L1 and L2 of the current paths from the contact portions between the first layer 60a and the major surface 10a to the columnar portions CL changes according to the position of the columnar portion CL. Therefore, there is a possibility that the fluctuation of the cell current may enlarge due to the length "L1-L2" of the current path. Moreover, when considering the progress of the downscaling of future memory devices, this may become one cause that reduces the reliability.

Figure 9:
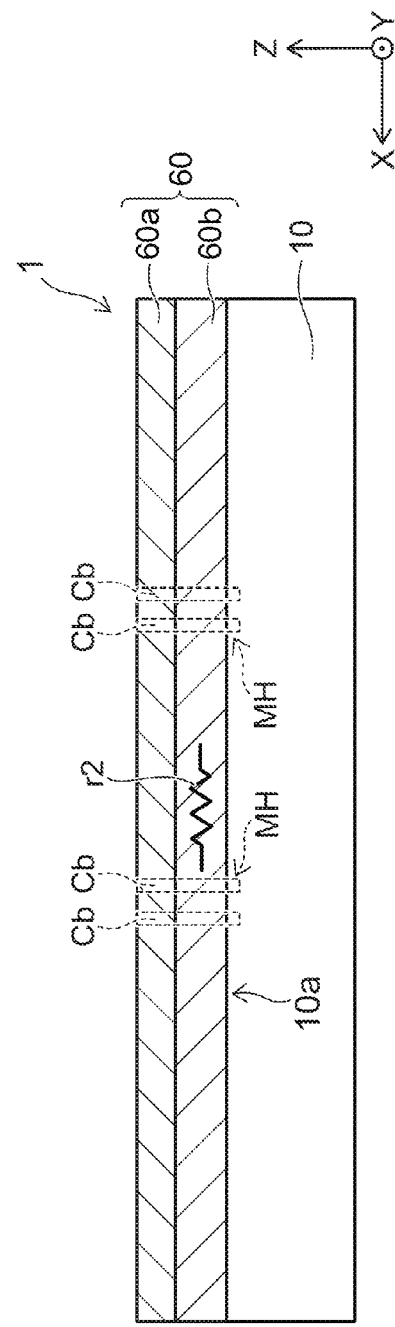
FIG. 9 is a schematic cross-sectional view of the semiconductor device of the first embodiment

FIG. 9 is a schematic cross-sectional view of the semiconductor device of the first embodiment.

As shown in FIG. 9, in the first embodiment, the second layer 60b in the memory cell array 1 is provided to be continuous directly on the major surface 10a of the substrate 10 or on the major surface 10a with the barrier film 61 interposed. The resistance value of the conductor 60 on the major surface 10a of the substrate 10 is substantially uniform in the memory cell array 1. Therefore, unlike the reference example, the occurrence locations of the fluctuation of the cell current caused by the difference between the resistance values and the lengths of the current paths are structurally eliminated. Accordingly, in the first embodiment, the advantage can be obtained in which the progress of the downscaling of future memory devices is possible while suppressing the decrease of the reliability.

Thus, according to the first embodiment, the conductor 60 that is filled into the slit ST has the stacked structure including the first layer 60a and the second layer 60b. The value of the thermal expansion coefficient $\alpha_3$ of the second layer 60b is in the direction from the value of the thermal expansion coefficient $\alpha_2$ of the first layer 60a toward the value of the thermal expansion coefficient $\alpha_1$ of the substrate 10. Therefore, compared to the case where only the conductor 60 is filled into the slit ST, the stress of the conductor 60 on the stacked body 100 and the substrate 10 can be relaxed. Accordingly, according to the first embodiment, peeling of the stacked body 100 and warp of the substrate 10 can be suppressed.

Further, according to the first embodiment, the second layer 60b is provided to be continuous on the major surface 10a of the substrate 10 in the memory cell array 1. Therefore, the difference between the cell currents caused by the difference between the resistance values and the difference between the distances can be small. Accordingly, the progress of the downscaling of future memory devices is possible while suppressing the decrease of the reliability.

A method for manufacturing the semiconductor device of the first embodiment will now be described.

FIG. 10 to FIG. 18 are schematic cross-sectional views showing the method for manufacturing the semiconductor device of the first embodiment. The manufacturing method shown in FIG. 10 to FIG. 18 is described with a focus on the manufacturing processes of the plate portion PT. The plate portion PT is formed after the columnar portions CL are formed. The manufacturing processes of the columnar portions CL are omitted.

Figure 10:
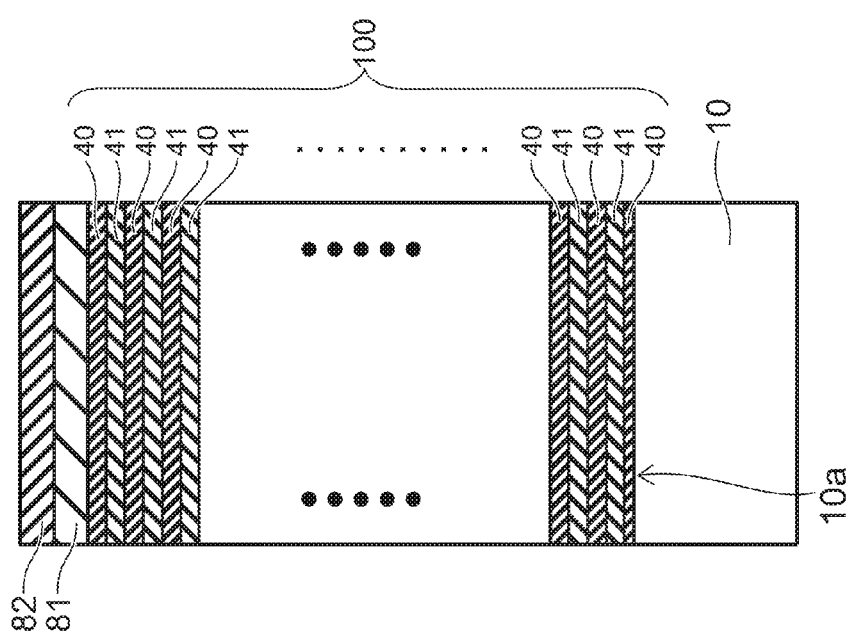

The location where the plate portion PT is to be formed after the columnar portions CL are formed is shown in FIG. 10. As shown in FIG. 10, the stacked body 100 is formed on the major surface 10a of the substrate 10. At the stage shown in FIG. 10, the stacked body 100 is in the state in which the insulators 40 and replacement members 41 are stacked alternately. The replacement members 41 are members that are replaced with the electrode layers (SGD, WL, and SGS) subsequently. The material of the replacement members 41 is selected from materials that can provide etching selectivity with respect to the insulators 40. For example, in the case where silicon oxide is selected as the insulators 40, silicon nitride is selected as the replacement members 41. The first insulating film 81 is formed on the stacked body 100. The second insulating film 82 is formed on the first insulating film 81. The second insulating film 82 covers the upper ends of the memory holes MH in a not-shown location. Thereby, the columnar portions CL are protected from the formation processes of the plate portion PT, e.g., the etching process, etc.

Figure 11:
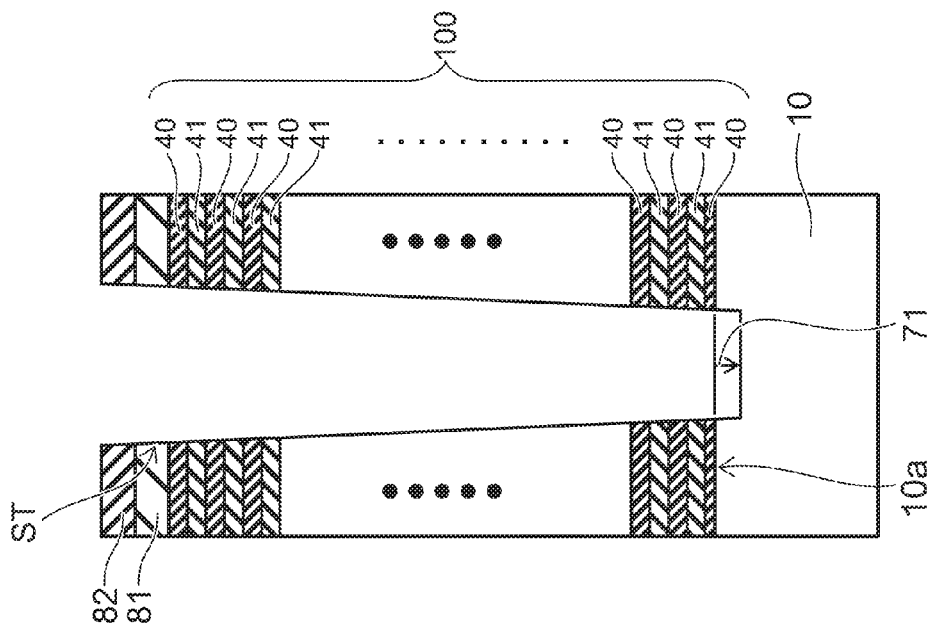
FIG. 10 to FIG. 18 are schematic cross-sectional views showing the method for manufacturing the semiconductor device of the first embodiment.

Then, as shown in FIG. 11, the slit ST is made in the stacked body 100 via the second insulating film 82 and the first insulating film 81. The slit ST is made by anisotropic etching of the stacked body 100 to reach the substrate 10. After the anisotropic etching reaches the substrate 10, over-etching of the substrate 10 is performed. Thereby, the recess portion 71 is made in the major surface 10a of the substrate 10.

Figure 12:
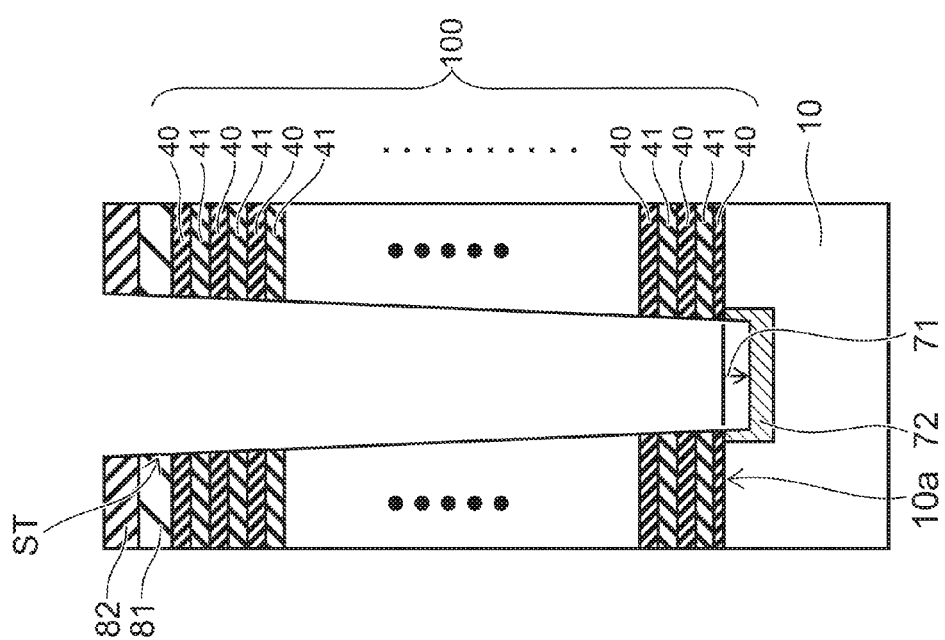

Then, as shown in FIG. 12, the semiconductor region 72 is formed in the substrate 10 to correspond to the recess portion 71. The semiconductor region 72 is formed in the substrate 10 via the slit ST by, for example, introducing an impurity of the opposite conductivity type of the substrate 10. In the case where the conductivity type of the substrate 10 is the P-type, an N-type impurity (a donor), e.g., As or P, is introduced.

Figure 13:
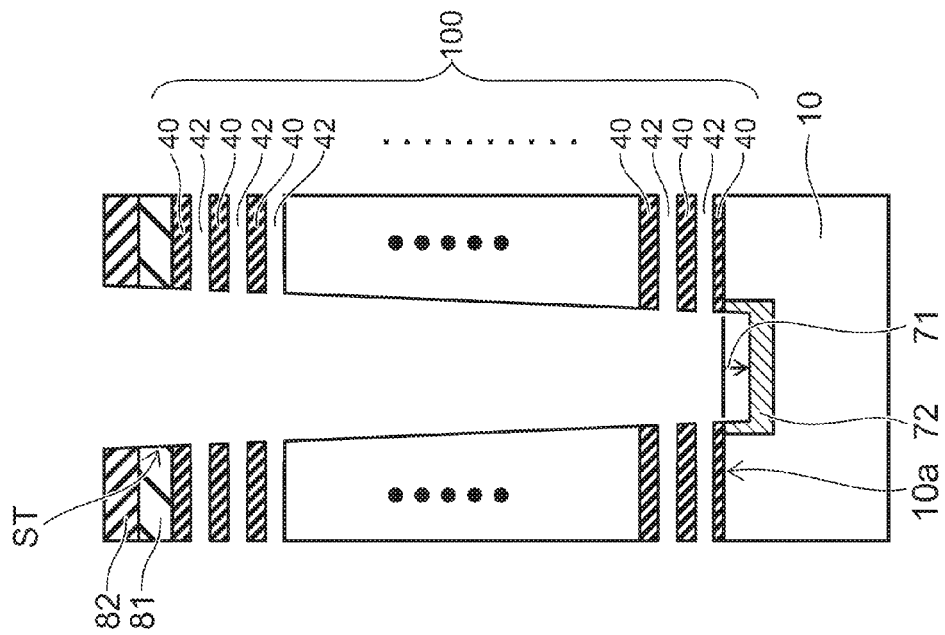

Then, as shown in FIG. 13, the replacement members 41 are removed via the slit ST. A space 42 is made between the insulator 40 and the insulator 40 by removing the replacement member 41. In particular, although not-shown, the space 42 reaches the columnar portion CL via the region between the insulator 40 and the insulator 40.

Figure 14:
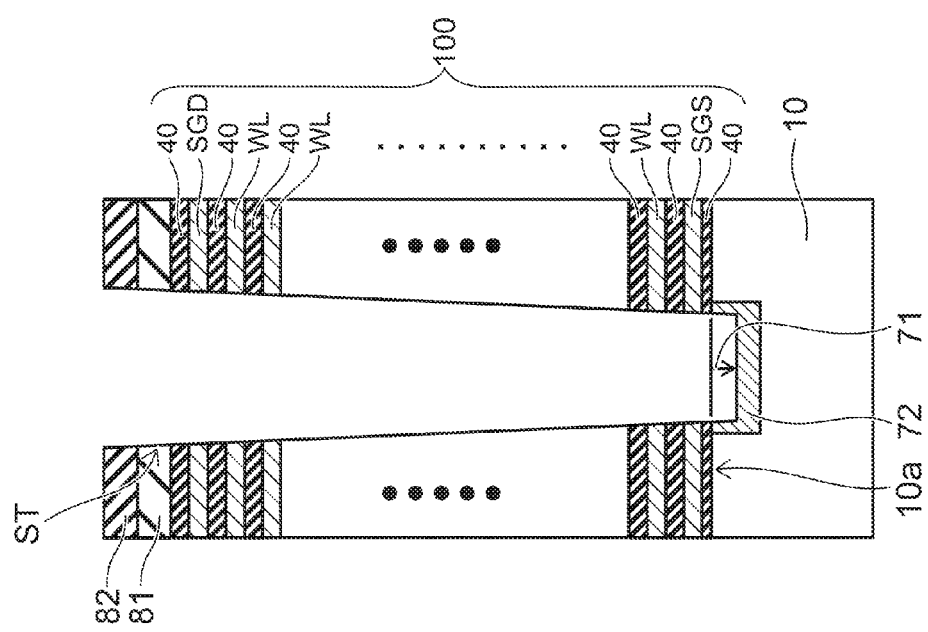

Then, as shown in FIG. 14, a conductor is filled into the space 42 via the slit ST. Thereby, the electrode layers (SGD, WL, and SGS) are formed between the insulator 40 and the insulator 40. The conductor is, for example, tungsten. For example, the electrode layers (SGD, WL, and SGS) are formed as follows. For example, a layer of tungsten is grown on the structure shown in FIG. 13 using CVD. Then, anisotropic etching of the layer of tungsten grown on the second insulating film 82, the first insulating film 81, the stacked body 100, the insulating film 82, and the semiconductor region 72 (the substrate 10) is performed so that layers of tungsten remain to be separated from each other between the insulator 40 and the insulator 40. Thereby, the electrode layers (SGD, WL, and SGS) are thus formed between the insulator 40 and the insulator 40.

Figure 15:
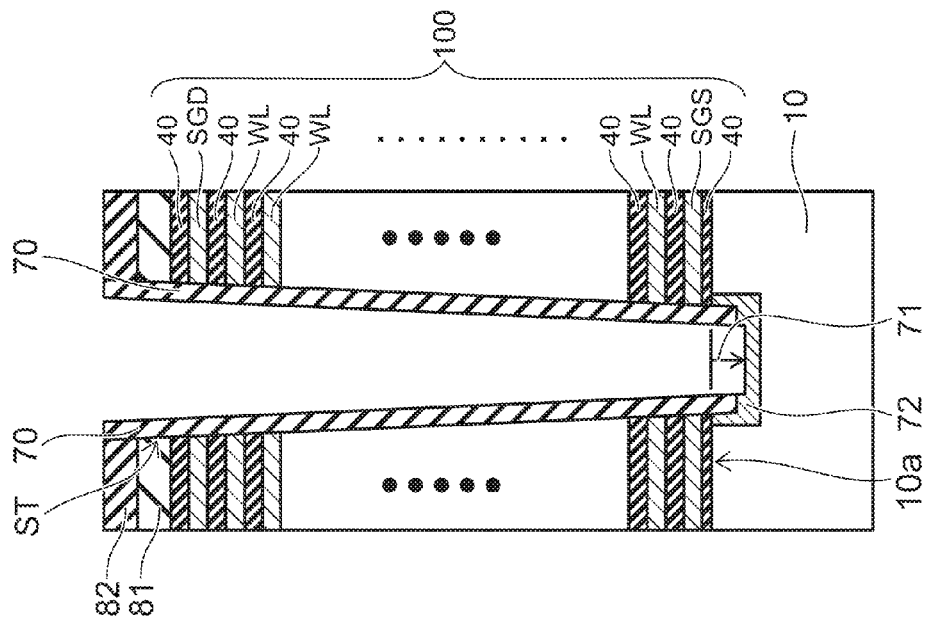

Then, as shown in FIG. 15, the sidewall insulating film 70 is formed in the slit ST. The sidewall insulating film 70 is deposited on the second insulating film 82 and on the first insulating film 81, the stacked body 100, and the semiconductor region 72 (the substrate 10) exposed in the slit ST by depositing, for example, silicon oxide using CVD. Then, anisotropic etching of the deposited silicon oxide is performed; and the silicon oxide is formed to remain in a sidewall configuration in the slit ST.

Figure 16:
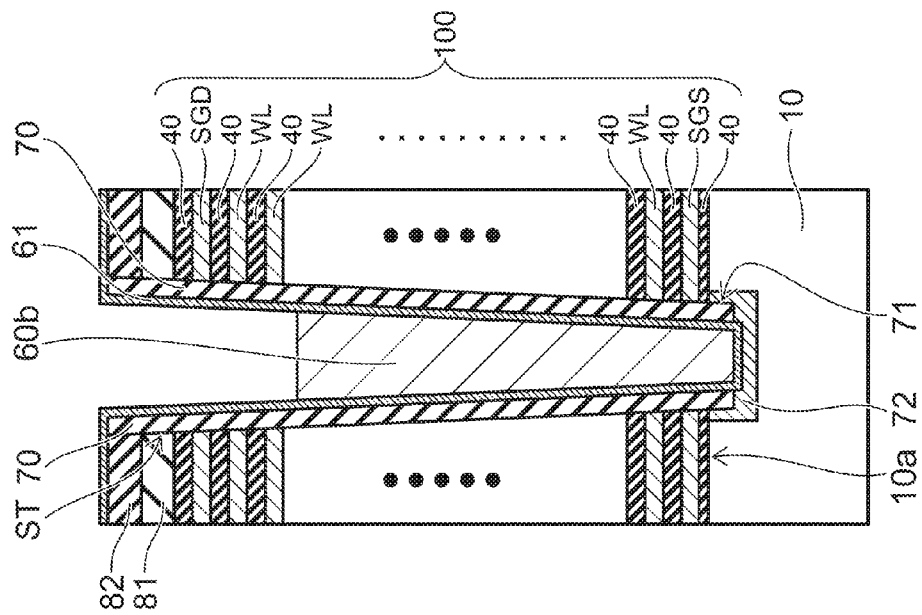

Then, as shown in FIG. 16, the barrier film 61 is formed on the entire surface of the structure shown in FIG. 15. The barrier film 61 is formed by, for example, depositing titanium, or titanium and titanium nitride, on the second insulating film 82, the sidewall insulating film 70, and the semiconductor region 72 (the substrate 10) exposed at the bottom portion of the slit using CVD. Then, for example, polysilicon including an N-type impurity is deposited on the barrier film 61. Thereby, an N-type polysilicon layer 62 is formed on the barrier film 61. The interior of the slit ST is filled with the N-type polysilicon layer 62.

Figure 17:
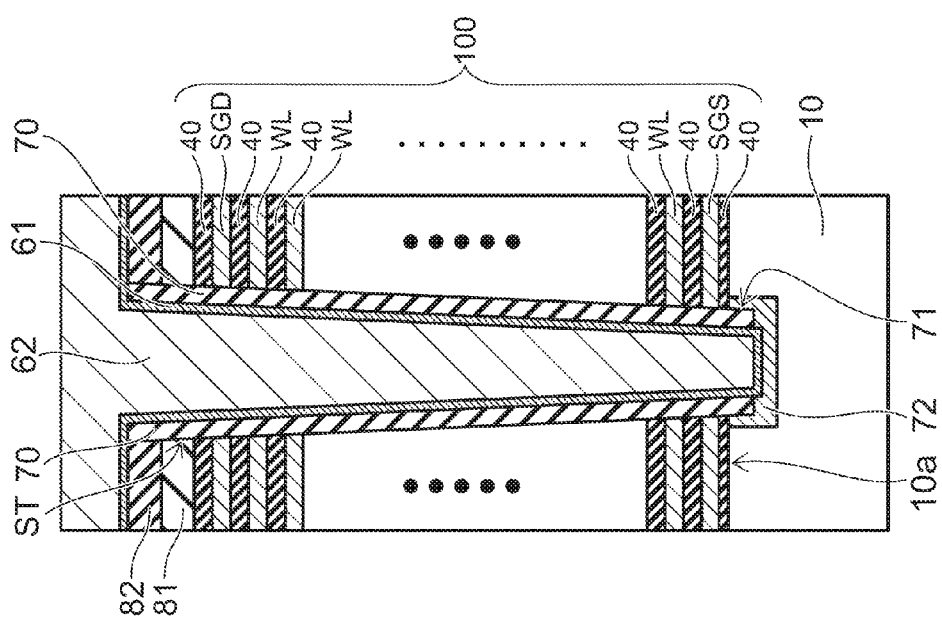

Then, as shown in FIG. 17, the N-type polysilicon layer 62 is caused to recede to the interior of the slit ST. Thereby, the second layer 60*b* is formed in the interior of the slit ST.

Figure 18:
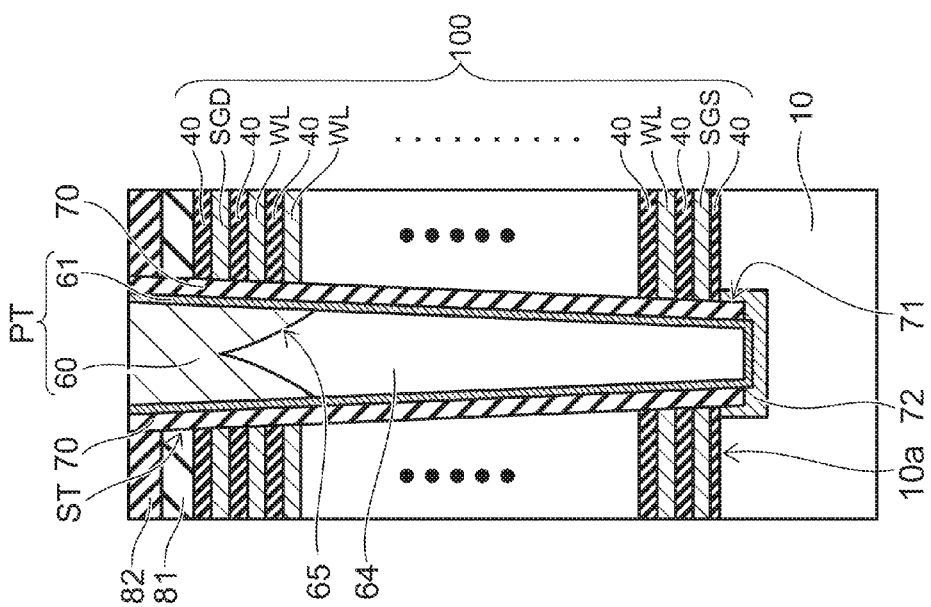

Then, as shown in FIG. 18, for example, tungsten is deposited on the barrier film 61 and on the second layer 60*b* exposed at the bottom portion of the slit ST. Thereby, a tungsten layer 63 is formed on the barrier film 61 and the second layer 60*b*. The interior of the slit ST is filled with the tungsten layer 63.

Then, as shown in FIG. 3 and FIG. 4, the tungsten layer 63 is caused to recede to the upper end of the slit ST. Also, the barrier film 61 that is on the second insulating film 82 is removed. The tungsten layer 63 and the barrier film 61 are filled into the slit ST. The tungsten layer 63 becomes the first layer 60*a*. Thereby, the plate portion PT that includes the first layer 60*a* and the second layer 60*b* is formed. Then, the third insulating film 83 is formed on the second insulating film 82, the barrier film 61, and the plate portion PT. Then, the contact portion Cb is formed in the third insulating film 83 and the second insulating film 82; and the contact portion Cs is formed in the third insulating film 83.

For example, the semiconductor device of the first embodiment can be manufactured by such a manufacturing method.

Figure 19:
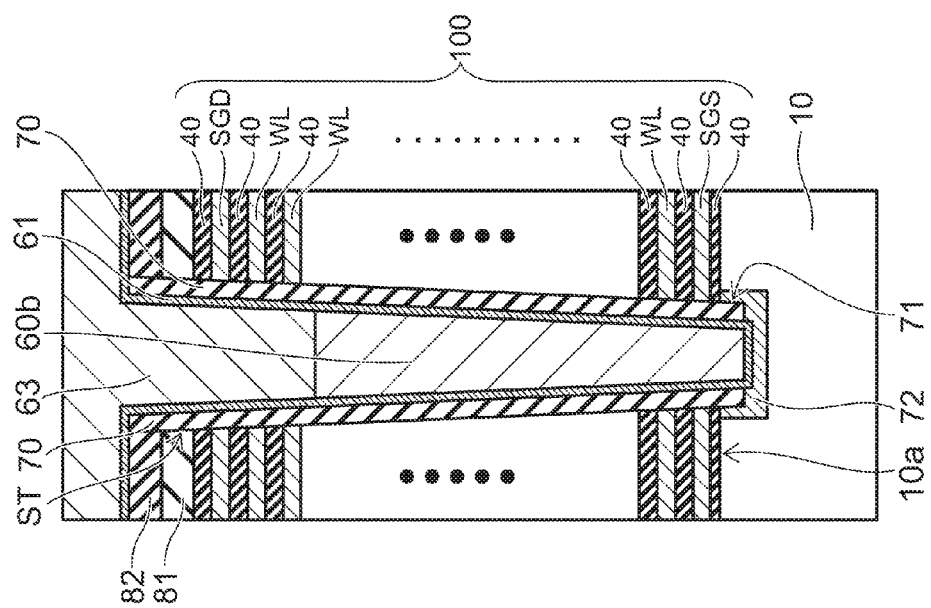
FIG. 19 is a schematic cross-sectional view of a semiconductor device of a second embodiment.

FIG. 19 is a schematic cross-sectional view of a semiconductor device of a second embodiment. For example, the cross section shown in FIG. 19 corresponds to the cross section shown in FIG. 4. However, the columnar portion CL and the structure above the third insulating film 83 are not shown. In the second embodiment, the structure above the third insulating film 83 and the configuration of the columnar portion CL are the same as those of the first embodiment. For the third to sixth embodiments described below as well, similarly to the second embodiment, the columnar portion CL and the structures above the third insulating film 83 are not shown.

As shown in FIG. 19, the second embodiment differs from the first embodiment in that an air gap 64 is provided in the slit ST between a bottom surface 65 of the conductor 60 of the plate portion PT and the barrier film 61 provided on the major surface 10*a* of the substrate 10. The barrier film 61 is provided also between the side surface of the conductor 60 and the side surface of the sidewall insulating film 70. In the second embodiment, the conductor 60 includes, for example, tungsten. The barrier film 61 is a conductor. The barrier film includes, for example, titanium. The conductor 60 is electrically connected to the semiconductor region 72 (the substrate 10) via the barrier film 61.

For example, the air gap 64 can be made by adjusting the step coverage of, for example, the tungsten included in the conductor 60 when depositing the tungsten. By adjusting the step coverage, the air gap 64 is made between the bottom surface 65 of the conductor 60 and the barrier film 61 provided on the major surface 10*a* by forming the tungsten as a film having a configuration that does not completely fill the slit ST.

The air gap 64 is made in a pattern similar to that of the second layer 60*b* of the first embodiment. As shown in FIG. 5 and FIG. 6, the air gap 64 is provided to cross through the memory cell array 1 from the first stairstep structure portion 2*a* to the second stairstep structure portion 2*b*.

According to the second embodiment, the air gap 64 is provided in the slit ST. Therefore, compared to the case where there is no air gap 64, the volume of the conductor 60 decreases. By reducing the volume of the conductor 60, the stress of the conductor 60 on the stacked body 100 and the substrate 10 can be relaxed. Accordingly, according to the second embodiment, similarly to the first embodiment, the peeling of the stacked body 100 and the warp of the substrate 10 can be suppressed.

Figure 20:
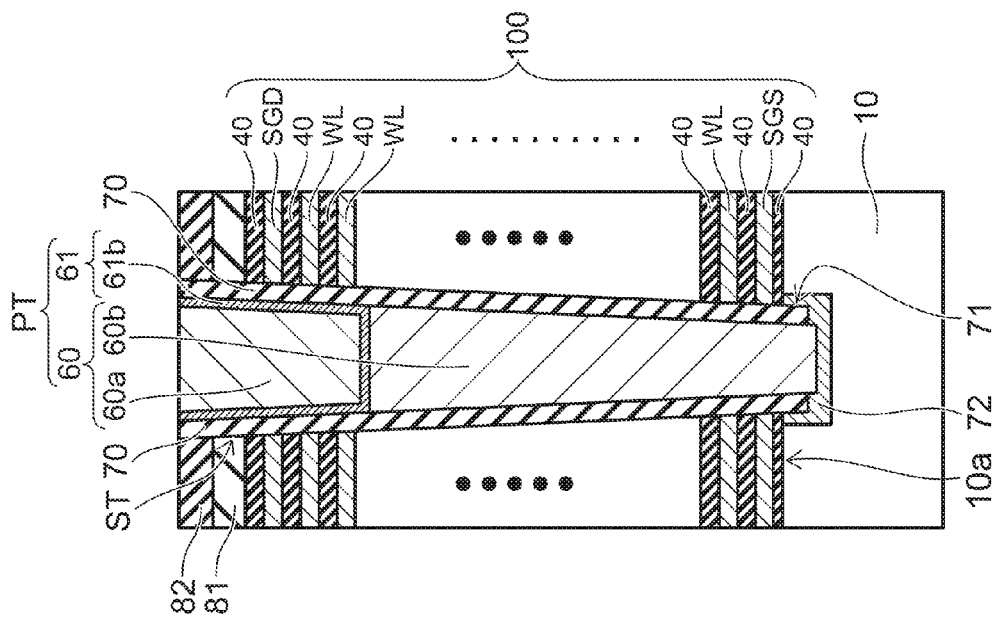
FIG. 20 is a schematic cross-sectional view of a semiconductor device of a third embodiment.

FIG. 20 is a schematic cross-sectional view of a semiconductor device of a third embodiment. For example, the cross section shown in FIG. 20 corresponds to the cross section shown in FIG. 4.

As shown in FIG. 20, the third embodiment differs from the first embodiment in that the barrier film 61 includes a first barrier film 61*a* and a second barrier film 61*b*. Similarly to the barrier film 61 of the first embodiment, the first barrier film 61*a* is provided on the semiconductor region 72 (the substrate 10) and the side surface of the sidewall insulating film 70. The second barrier film 61*b* is provided between the first layer 60*a* and the first barrier film 61*a* and between the first layer 60*a* and the second layer 60*b*.

As in the third embodiment, the barrier film 61 may include the first barrier film 61*a* and the second barrier film 61*b*. For example, there is a possibility that the thickness of the first barrier film 61*a* may become thin or the first barrier film 61*a* may disappear when causing the polysilicon layer to recede to form the second layer 60*b*. However, in the third embodiment, for example, the second barrier film 61*b* is formed after causing the polysilicon layer to recede. Therefore, the first layer 60*a* can be formed on the second barrier film 61*b* even in the case where the thickness of the first barrier film 61*a* becomes thin or the first barrier film 61*a* disappears. Accordingly, compared to the case where the barrier film 61 does not include the first barrier film 61*a* and the second barrier film 61*b*, for example, the adhesion strength between the first layer 60*a* and the sidewall insulating film 70 does not decrease easily. Also, because the second barrier film 61*b* is provided between the first layer 60*a* and the second layer 60*b*, the adhesion strength between the first layer 60*a* and the second layer 60*b* also is higher.

Figure 21:
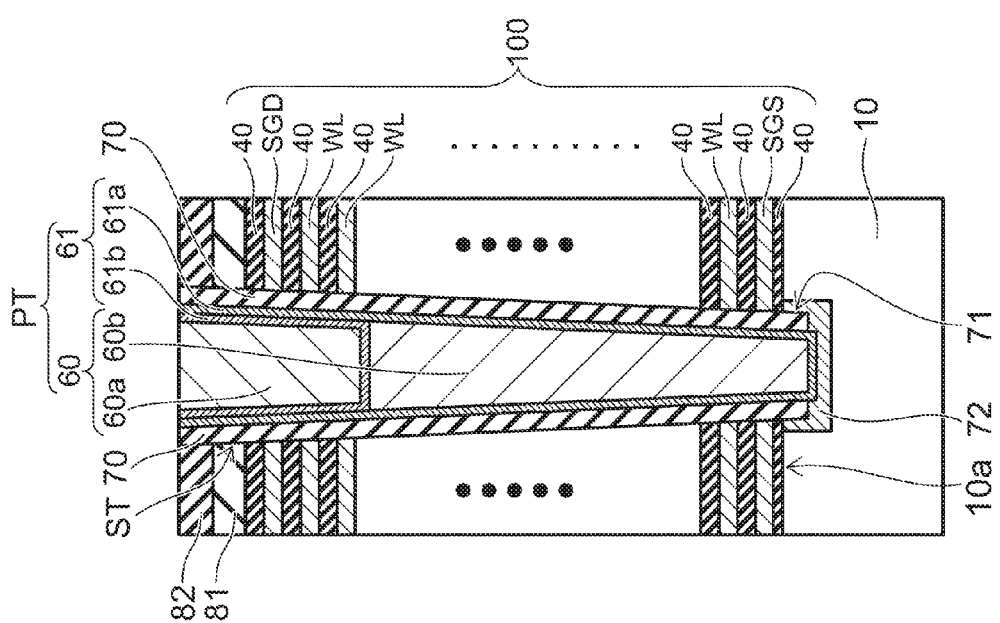
FIG. 21 is a schematic cross-sectional view of a semiconductor device of a fourth embodiment.

FIG. 21 is a schematic cross-sectional view of a semiconductor device of a fourth embodiment. For example, the cross section shown in FIG. 21 corresponds to the cross section shown in FIG. 20.

As shown in FIG. 21, the fourth embodiment differs from the third embodiment in that there is no first barrier film 61*a* in the barrier film 61; and the barrier film 61 is only the second barrier film 61*b*. The second layer 60*b* is, for example, polysilicon or silicon oxide.

The adhesion between polysilicon and silicon is better than the adhesion between tungsten and silicon. Similarly, the adhesion between polysilicon and silicon oxide is better than the adhesion between tungsten and silicon oxide. The adhesion between silicon oxide and silicon also is better than the adhesion between tungsten and silicon. Similarly, the adhesion between silicon oxide and silicon oxide is better than the adhesion between tungsten and silicon oxide.

In the case where the adhesion is good between the second layer 60*b* and the structure bodies at the periphery of the second layer 60*b*, it is also possible to omit the barrier film 61 at the periphery of the second layer 60*b*. The barrier film 61 may be provided only at the second barrier film 61*b*.

Figure 22:
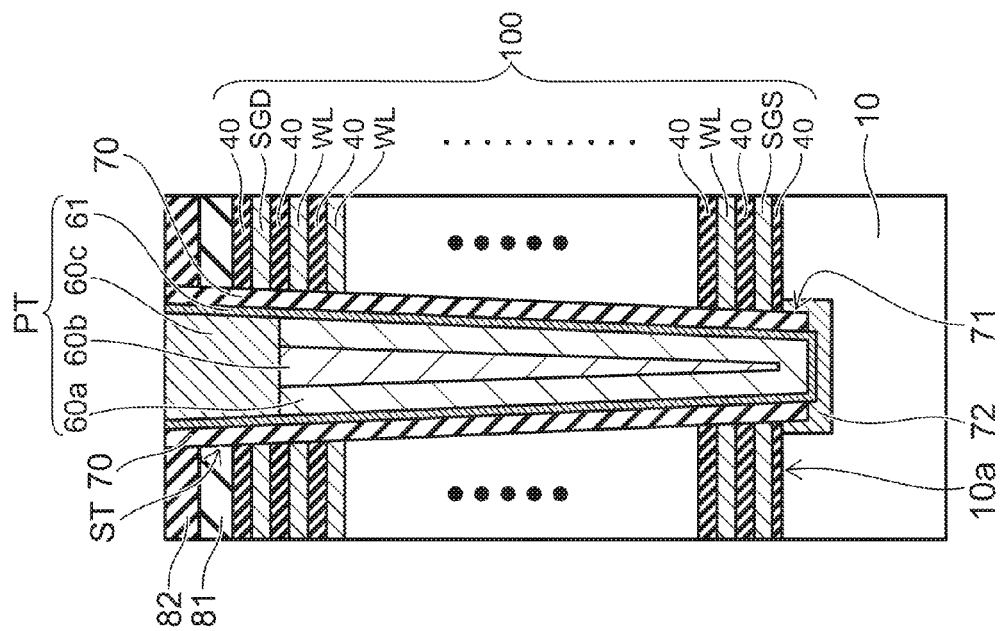
FIG. 22 is a schematic cross-sectional view of a semiconductor device of a fifth embodiment.

FIG. 22 is a schematic cross-sectional view of a semiconductor device of a fifth embodiment. For example, the cross section shown in FIG. 22 corresponds to the cross section shown in FIG. 4.

As shown in FIG. 22, the fifth embodiment differs from the first embodiment in that in the conductor 60, the first layer 60*a* is provided on the outer side of the conductor 60; and the second layer 60*b* is provided on the inner side of the conductor 60. In the fifth embodiment, the first layer 60a is provided along the barrier film 61 on the barrier film 61. The second layer 60b is provided along a recess occurring in the first layer 60a on the first layer 60a. The interior of the slit ST is filled with the first layer 60a and the second layer 60b. The first layer 60a is, for example, tungsten. The second layer 60b is, for example, polysilicon.

In the fifth embodiment as well, the conductor 60 includes the first layer 60a and the second layer 60b. Therefore, the stress of the conductor 60 on the stacked body 100 and the substrate 10 can be relaxed. Accordingly, according to the second embodiment, similarly to the first embodiment, the peeling of the stacked body 100 and the warp of the substrate 10 can be suppressed.

Figure 23:
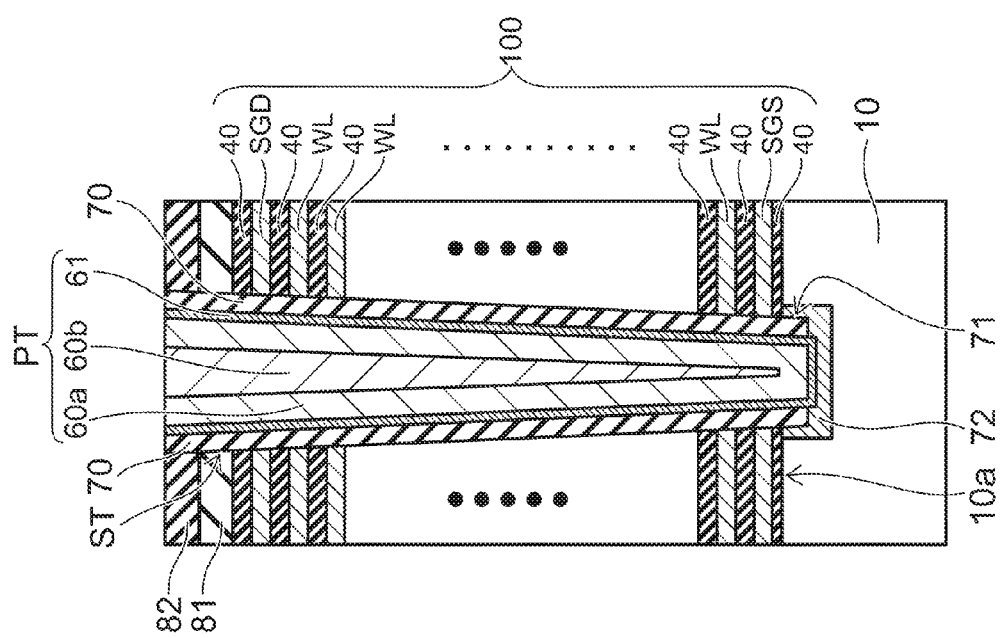
FIG. 23 is a schematic cross-sectional view of a semiconductor device of a sixth embodiment.

FIG. 23 is a schematic cross-sectional view of a semiconductor device of a sixth embodiment. For example, the cross section shown in FIG. 23 corresponds to the cross section shown in FIG. 22.

As shown in FIG. 23, the sixth embodiment differs from the fifth embodiment in that a third layer 60c is provided at the upper portion of the conductor 60. The third layer 60c is provided on the first layer 60a and the second layer 60b. Thereby, the second layer 60b is filled into the interior of the conductor 60 by the first layer 60a and the second layer 60b. The first layer 60a and the third layer 60c are, for example, tungsten. The second layer 60b is, for example, polysilicon. As in the sixth embodiment, the second layer 60b may be filled into the interior of the conductor 60.

According to the embodiments, the peeling of the stacked body 100 and the warp of the substrate 10 can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate having a major surface, a thermal expansion coefficient of the substrate being $\alpha_1$;
a stacked body provided on the major surface of the substrate, the stacked body including a plurality of electrode layers and a memory cell array, the plurality of electrode layers stacked with an insulator interposed;
a columnar portion provided in the stacked body, the columnar portion extending along a stacking direction of the stacked body, the columnar portion including a semiconductor body and a charge storage film, the charge storage film provided between the semiconductor body and the electrode layer;
a plate portion provided in the stacked body, the plate portion extending along the stacking direction of the stacked body and a first direction crossing the stacking direction, the plate portion including a first layer and a second layer, a thermal expansion coefficient of the first layer being $\alpha_2$, a thermal expansion coefficient of the second layer being $\alpha_3$, the $\alpha_2$ being different from the $\alpha_1$ the $\alpha_3$ being different from the $\alpha_2$, wherein
when a relationship between a value of the $\alpha_1$ and a value of the $\alpha_2$ is $\alpha_1 < \alpha_2$, a value of the thermal expansion coefficient $\alpha_3$ is $\alpha_3 < \alpha_2$, otherwise
when a relationship between a value of the $\alpha_1$ and a value of the $\alpha_2$ is $\alpha_1 > \alpha_2$, a value of the thermal expansion coefficient $\alpha_3$ is $\alpha_3 > \alpha_2$,
the first layer and the second layer stacked along the stacking direction of the stacked body, the second layer provided between the first layer and the major surface of the substrate, the second layer facing the major surface of the substrate continuously in the memory cell array; and
a sidewall insulating film provided in the stacked body, the sidewall insulating film provided between the stacked body and the plate portion,
wherein the stacked body includes a first stairstep structure portion and a second stairstep structure portion,
wherein the first stairstep structure portion and the second stairstep structure portion are provided respectively along one set of opposite sides of the memory cell array, and
wherein the plate portion is provided to cross through the memory cell array from the first stairstep structure portion to the second stairstep structure portion.

2. The semiconductor device according to claim 1, wherein
the first layer includes a first conductor, and
the second layer includes an insulator.

3. The semiconductor device according to claim 1, wherein
the first layer includes a first conductor, and
the second layer includes a second conductor different from the first conductor.

4. The semiconductor device according to claim 3, wherein a major component included in the substrate is the same as a major component included in the second layer.

5. The semiconductor device according to claim 4, wherein
the substrate includes silicon as the major component, and
the second layer includes silicon as the major component.

6. The semiconductor device according to claim 5, wherein a conductivity type of the second layer is the same as a conductivity type of the substrate.

7. The semiconductor device according to claim 1, wherein the plate portion includes a first barrier film between the sidewall insulating film and a side surface of the plate portion and between a bottom surface of the plate portion and the major surface of the substrate.

8. The semiconductor device according to claim 7, wherein the plate portion includes a second barrier film between the first layer and the first barrier film and between the first layer and the second layer.

9. The semiconductor device according to claim 1, wherein the plate portion includes a barrier film between the first layer and the sidewall insulating film and between the first layer and the second layer.

* * * * *